US008981383B1

(12) United States Patent
Fish et al.

(10) Patent No.: US 8,981,383 B1
(45) Date of Patent: Mar. 17, 2015

(54) EFFICIENT SUBSTRATE HEAT TRANSFER LAYER FOR PHOTONIC DEVICES

(75) Inventors: Gregory Alan Fish, Santa Barbara, CA (US); Anand Ramaswamy, Goleta, CA (US)

(73) Assignee: Aurrion, Inc., Goleta, CA (US)

( * ) Notice: Subject to any disclaimer, the term of this patent is extended or adjusted under 35 U.S.C. 154(b) by 0 days.

(21) Appl. No.: 13/412,449

(22) Filed: Mar. 5, 2012

(51) Int. Cl.
*G02B 6/10* (2006.01)

(52) U.S. Cl.
USPC ............ 257/77; 257/E31.131; 385/131

(58) Field of Classification Search
CPC .. G02B 6/4214; G02B 6/4246; G02B 6/4272; H01L 31/024; H01L 31/052
USPC .............. 257/77, E31.131; 385/131
See application file for complete search history.

(56) References Cited

U.S. PATENT DOCUMENTS

| 5,284,525 | A  | * | 2/1994  | Saito et al. ............. 136/256 |
| 5,449,924 | A  | * | 9/1995  | Hur et al. ................. 257/54 |
| 6,545,333 | B1 | * | 4/2003  | Ketchen et al. ........... 257/461 |
| 6,552,366 | B1 | * | 4/2003  | Terada et al. ............... 257/84 |
| 2008/0043796 | A1 | * | 2/2008  | Jikutani et al. ........... 372/50.11 |
| 2010/0193892 | A1 | * | 8/2010  | Min ......................... 257/432 |
| 2010/0295083 | A1 | * | 11/2010 | Celler ........................ 257/98 |
| 2011/0156055 | A1 | * | 6/2011  | Mazellier ................... 257/77 |
| 2011/0272001 | A1 | * | 11/2011 | Li et al. ...................... 136/246 |

* cited by examiner

*Primary Examiner* — Steven J Fulk
(74) *Attorney, Agent, or Firm* — Schwegman Lundberg & Woessner, P.A.

(57) ABSTRACT

Embodiments of the invention describe substrates, used to form optical devices, which include high thermal conductivity intermediate layers. Said substrates comprise a bulk layer, an optical device layer comprising a first material, and an intermediate layer disposed between the bulk layer and the device layer comprising a second material having a higher thermal conductivity and a lower index of refraction than the first material.
In the resulting devices, said intermediate layer functions as part of the device layer structure—i.e., provides optical or electrical power dissipation (i.e. thermal) functionality for the device formed from said substrate. Thus, optical devices do not necessarily need to utilize an add-on packaging solution for heat absorption when formed from substrate stacks according to embodiments of the invention. Moreover, in some embodiments, said intermediate layer is located at "zero-distance" from the source of the heat generation, thereby efficiently transferring heat out of that region.

17 Claims, 5 Drawing Sheets

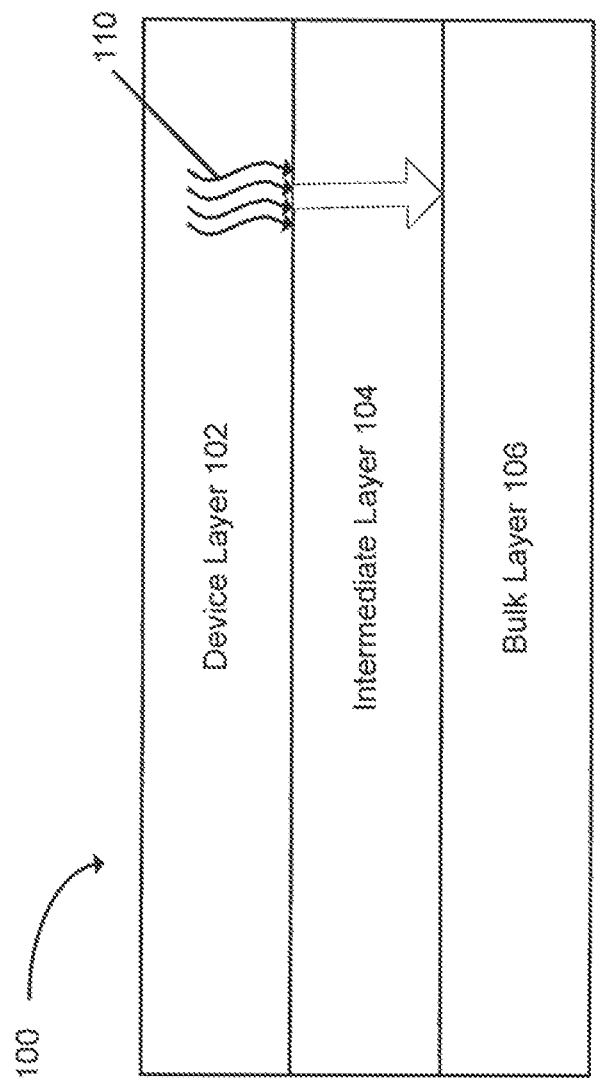

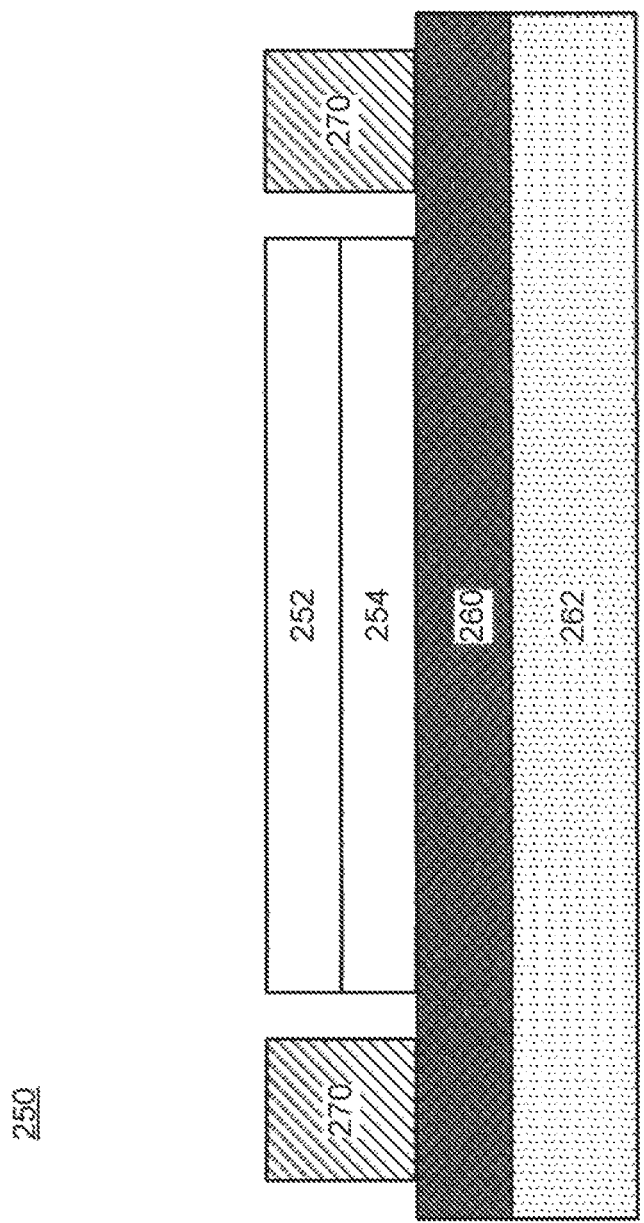

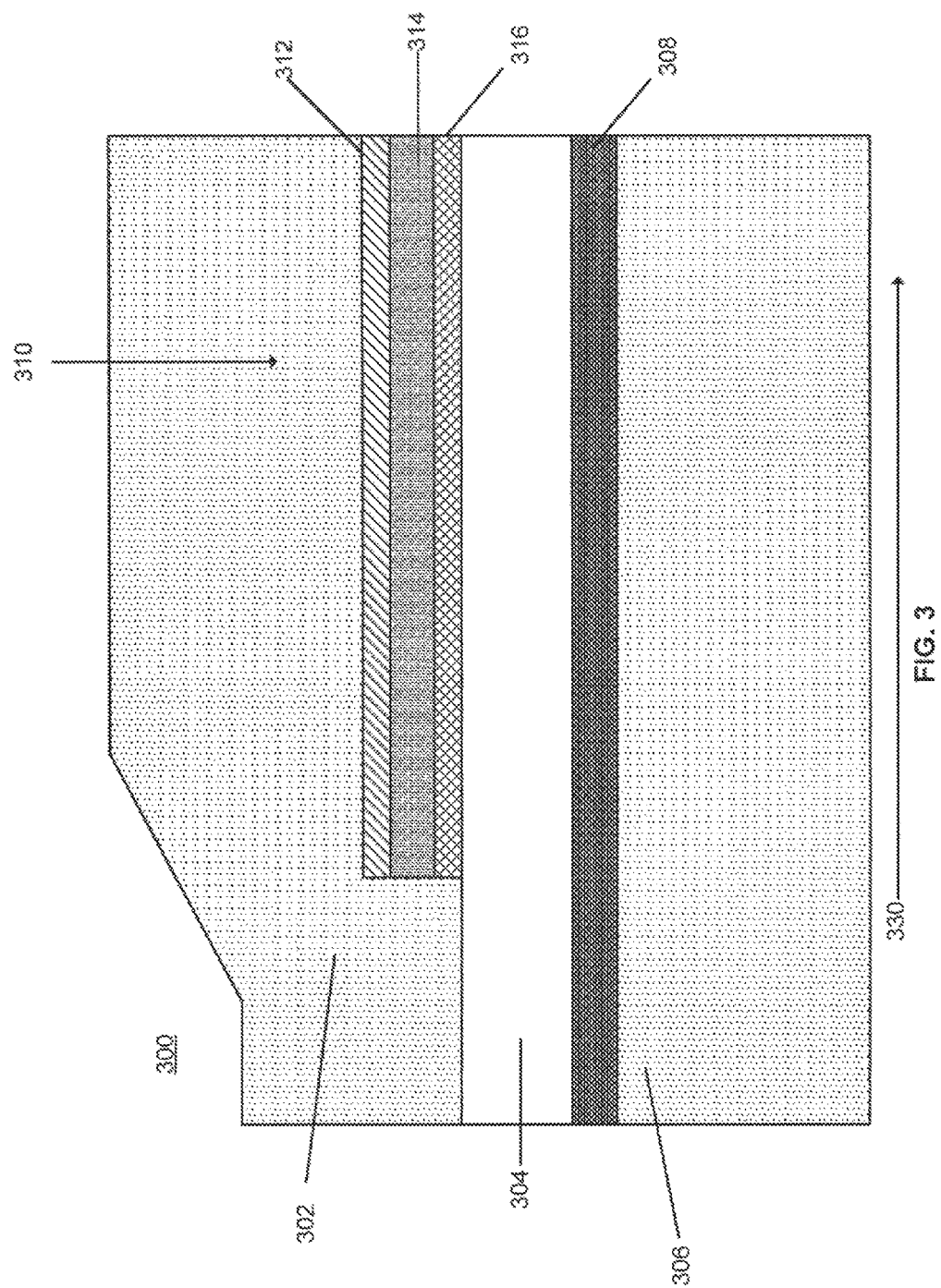

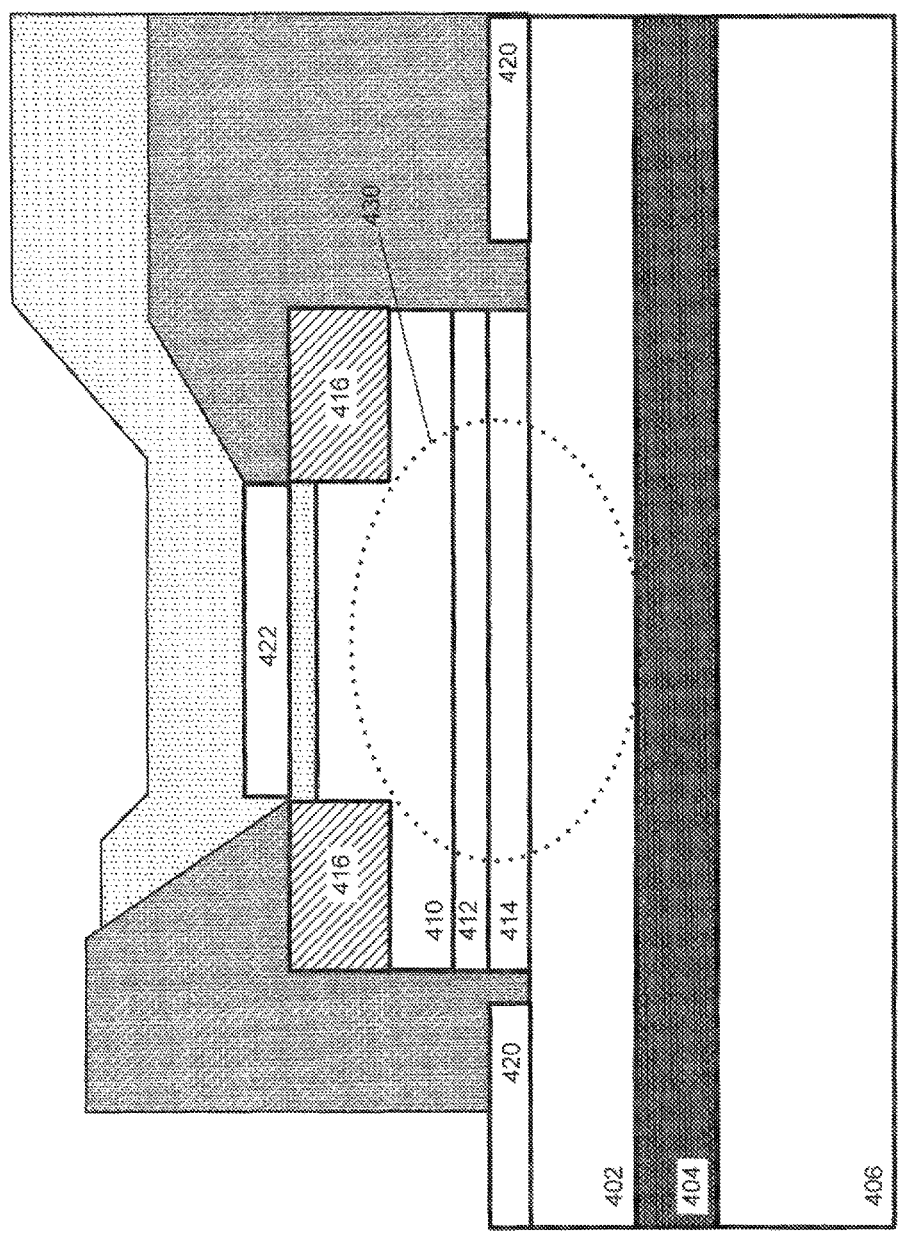

EFFICIENT SUBSTRATE HEAT TRANSFER LAYER FOR PHOTONIC DEVICES

FIELD

Embodiments of the invention generally pertain to optical devices and more specifically to means for efficiently transferring heat to substrate layers of optical devices.

BACKGROUND

The flow of current within photonic/optical devices results in electrical power dissipation, which causes the device to heat up. High temperatures produced by such power dissipation may result in catastrophic failure of the device. The use of heat absorption (i.e., heat sinking) material helps ensure device functionality for a wide range of temperatures. Current solutions involve bonding heat absorption material to an already formed optical device; however, these solutions add significant size to the device. Additionally, their efficacy is limited because they are situated relatively far away from the heat generation region. What is needed is an efficient heat transfer solution that does not adversely increase the size of an optical device.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 1 is a block diagram of an optical device substrate according to an embodiment of the invention.

FIG. 2B is an illustration of a surface illuminated photodetector according to an embodiment of the invention.

FIG. 3 is a block diagram of a waveguide photodetector according to an embodiment of the invention.

FIG. 4 is a block diagram of an optical device according to an embodiment of the invention.

Figure 2A:
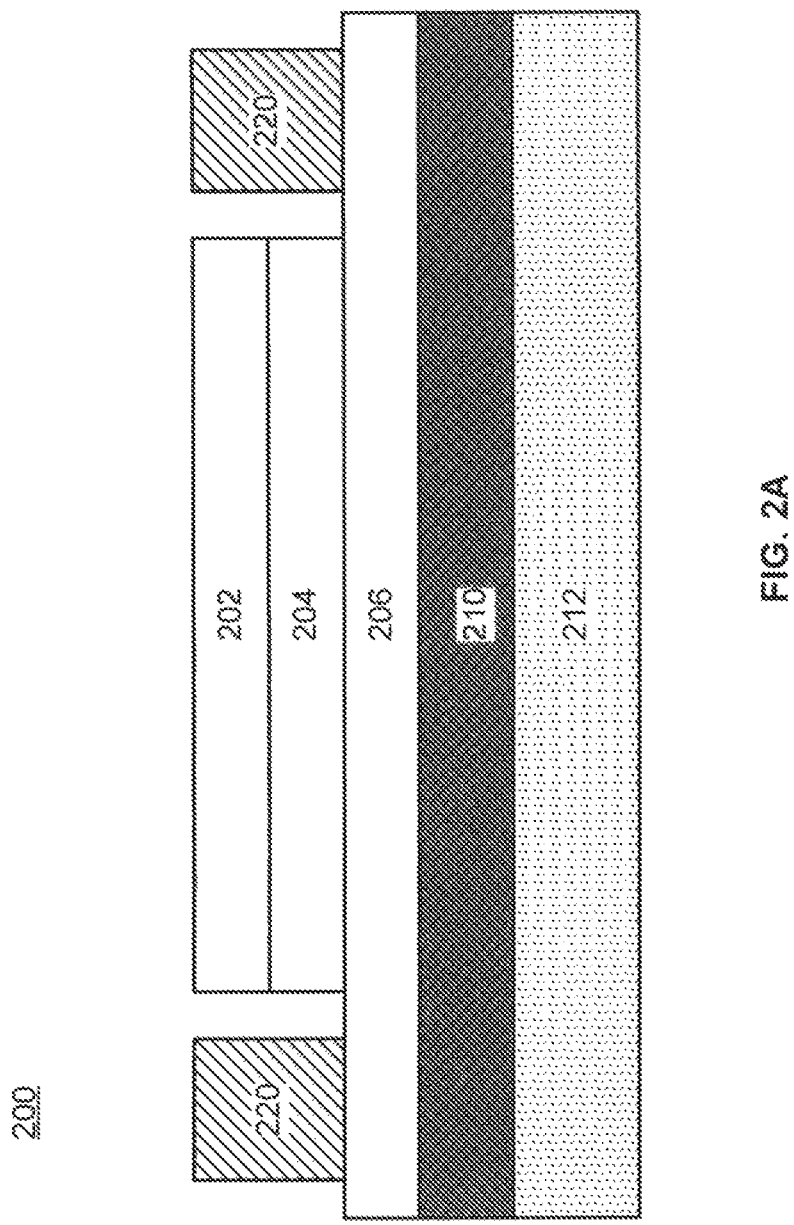
FIG. 2A is an illustration of a waveguide photodetector according to an embodiment of the invention.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DESCRIPTION

Embodiments of the invention describe methods and apparatuses for utilizing efficient substrate heat transfer layers in photonic devices. Throughout this specification, several terms of art are used. These terms are to take on their ordinary meaning in the art from which they come, unless specifically defined herein or the context of their use would clearly suggest otherwise. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Embodiments of the invention describe substrates, used to form optical devices, which include high thermal conductivity intermediate layers. Said substrates comprise a bulk layer, an optical device layer comprising a first material, and an intermediate layer disposed between the bulk layer and the device layer comprising a second material having a higher thermal conductivity and a lower index of refraction than the material in the optical device layer (i.e., the first material).

In the resulting devices, said intermediate layer functions as part of the device layer structure—i.e., provides optical or electrical functionality for the device formed from said substrate as described below. Thus, in contrast to prior art solutions, optical devices do not necessarily need to utilize an add-on packaging solution for heat absorption when formed from substrate stacks according to embodiments of the invention. Moreover, in some embodiments, said intermediate layer is located at "zero-distance" from the source of the heat generation, thereby efficiently transferring heat out of that region into the bulk layer of the device.

FIG. 1 is a block diagram of an optical device substrate according to an embodiment of the invention. In this embodiment, substrate stack 100 includes device layer 102, intermediate later 104, and bulk layer 106.

Typically, high current operation in optical devices is limited by space charge effects and thermal effects. Space charge effects may be mitigated by device design aspects; thermal effects on the other hand, are largely a material issue. For example, in surface illuminated Indium Gallium Arsenide-Indium Phosphide (InGaAs—InP) optical devices, the thermal conductivity of InP substrate (68 W/m·K) is a significant factor that limits the maximum current withstood by said devices.

In this embodiment, the flow of current within device layer 102 results in electrical power dissipation, causing the device formed from substrate 100 to potentially heat up. The effects of heating up of said device has important consequences for high-power, high current applications (e.g., photodetectors). Namely, the heat that is generated at device layer 102 may cause the device temperature to rise and, at a high enough value, damage the device layer thereby causing catastrophic device failure.

Substrate 100 includes high thermal conductivity intermediate layer 104. In this embodiment, said intermediate layer functions as part of the device layer structure—i.e., provides optical or electrical functionality for the device formed from said substrate, as described below. Thus, optical devices do not necessarily need to utilize an add-on packaging solution for heat absorption when formed from substrate stacks according to embodiments of the invention. Moreover, because intermediate layer 104 is located so close to the source of the heat generation (i.e., device layer 102), it will be very efficient in transferring heat out of that region and hence, lowering the peak operating temperature of the device.

As discussed below, embodiments of the invention such as substrate 100 may be utilized to form waveguides of optical devices. In silicon based prior art solutions, waveguides are formed using Silicon/Silicon Dioxide ($Si/SiO_2$) layers, as the refractive index contrast between Si (n=3.48) and $SiO_2$ (n=1.44) allows for the fabrication of small footprint, high index contrast waveguides that have low loss. However, the $SiO_2$ layer's poor thermal conductivity poses a serious problem, as heat travels down towards that layer (see, e.g., reference element 110 which illustrates a representation of heat generated at device layer 102).

Embodiments of the invention utilize intermediate layer 104, which has a higher thermal conductivity and a lower index of refraction than the material of device layer 102. For waveguiding purposes, the refractive index contrast allows the optical mode to be tightly confined in the waveguiding region. This ensures that light coupled into device layer 102 does not leak into substrate bulk layer 106. However, the higher thermal conductivity of intermediate layer 104 allows for efficient heat to transfer to bulk layer 106.

In some embodiments, intermediate layer 104 comprises Chemical Vapor Deposition (CVD) Diamond material, as diamond easily spreads the heat generated in device layer 102 and allows for efficient heat transfer to bulk layer 106. In other words, because diamond has a much lower thermal resistance than $SiO_2$, it functions more efficiently as a heat spreader. CVD Diamond may have a thermal conductivity close to 1000 W/m·K, which is close to a factor of 1000 times greater than the thermal conductivity of $SiO_2$.

FIG. 2A is a block diagram of a waveguide photodetector according to an embodiment of the invention. In this embodiment, the waveguide photodetector is illustrated to be a p-i-n photodetector, including n-type layer 202, intrinsic layer 204, and p-type layer 206. In this example embodiment, photodetector 200 comprises a Silicon Germanium (Si—Ge) photodetector, where layers 202 and 204 comprise Ge semiconductor material, while layer 206 comprises Si semiconductor material. In other embodiments, the above described layers may be comprised of any combination of materials.

Layer 210 may comprise a material having a higher thermal conductivity In this embodiment, electrodes 220 are shown to be electrically coupled via layer 206, thus layer 206 is described to provide electrical functionality to photodetector 200. However, layer 206 is in direct contact with layer 210 which provides thermal heat sinking capability. Hence, if layer 210 is of a high thermal conductivity it can "sink" or absorb the heat that is generated in the device formed by layers 202, 204 and 206. Moreover, since this is an embodiment of a waveguide detector, layer 210 which has properties of the intermediate layer 104 (i.e. lower refractive index than the material of layer 206 above it), described in FIG. 1, provides optical functionality to the device. This results in layer 210 being an intimate part of the device and consequently, it is at zero-gap or zero distance from the heat generation part of the device.

FIG. 2B is an illustration of a surface illuminated photodetector according to an embodiment of the invention. In this embodiment, surface-illuminated photodetector 250 (alternatively referred to herein as a surface-normal photodetector) includes layer 260 which provides electrical functionality (via electrodes 270) as well as thermal functionality by being made of a doped (electrically conductive), high thermal conductivity material. Said electrical functionality is enabled by the fact that layer 260 thus has a "zero distance" as it is part of the device formed by layers 252, 254 and itself. This "zero distance" is enabled by either depositing layer 260 or bonding layer 260 to bulk layer 262 via any process known in the art. This "zero-distance" allows for device 250 to have an efficient heat transfer solution that does not adversely increase its size—i.e., device 250 is formed from a stack including layer 260, thereby eliminating the add-on packaging size of prior art solutions.

FIG. 3 is a block diagram of a waveguide photodetector according to an embodiment of the invention. The two basic functions of semiconductor waveguide photodetector 300 are 'waveguiding' and 'photodetection.' In this embodiment, photodetector 300 as illustrated includes p-type substrate layer 302, n-type substrate layer 306, waveguide region 304, and photodetector region 310 (shown to include p-type absorber layer 312, absorber layer 314 and n-type termination layer 316). Photodetector 300 may comprise any optically functional semiconductor material known in the art (e.g., said substrate layers may comprise InP, said waveguide layer may comprise Indium Gallium Arsenide Phosphide (InGaAsP), and said absorber layer may comprise InGaAs).

As light propagates along waveguide 304 from the side of photodetector 300, it encounters photodetector region 310 where it is absorbed, thereby generating carriers (i.e., electrons and holes) that get swept out of the applied filed and subsequently collected at N and P pads (not shown). Here, the direction of absorption via region 310 is transverse to the direction of light propagation. In designing waveguide layer 304, the core of the waveguide may have a higher refractive index than the device's cladding layer (i.e., layer 308) in order to confine the beam. Additionally, the core of waveguide layer 304 may have low optical propagation loss at the wavelengths of interest.

The above described heat-absorption problems of optical devices become even more acute for embodiments where waveguide photodetector 300 comprises III-V semiconductor material, such as InP, because ternary absorber layer 312 (e.g., InGaAs) sits on quaternary waveguide layer 304 (e.g., InGaAsP). The thermal conductivities of these two layers in such a configuration are 4.7 W/m·K and 4 W/m·K, respectively. Prior art solutions for cladding layer 308 impose a serious limit on the power handling capability of device 300 (compared to, for example, the surface illuminated InP photodetector described above with reference to FIG. 2).

In this embodiment, most of the heat generated by device 300 occurs in absorber region 312. This heat travels downwards and then spreads laterally. The presence of lower thermal conductivity layers in prior art solutions prevents the heat from being dissipated via the substrate and hence, the temperature builds up in the device layers. Thus, embodiments of the invention utilize intermediate layer 308 to function as a heat spreader for the active region and a waveguide cladding layer for optical waveguide 304 from which light is coupled into absorbing layer 312.

Because intermediate layer 308 efficiently spreads the heat generated from the absorbing region to bulk layer 306, the peak temperature of device 300 drops without the need for heat sinking materials. Furthermore, in embodiments of the invention utilizing materials such as CVD Diamond to form intermediate layer 308, said layer can be relatively thin compared to conventional cladding layers used in the prior art due to the high thermal conductivity and low index of refraction of the material—i.e., because the heat spreads laterally very efficiently, there is no additional benefit for added thickness to intermediate layer 308 when comprised from CVD Diamond.

FIG. 4 is a block diagram of an optical device according to an embodiment of the invention. In this embodiment, device 400 is a hybrid electro-optic device that includes a silicon semiconductor slab including silicon top layer 402, cladding layer 404 and silicon substrate layer 406. Cladding layer 404 may comprise any material having a higher thermal conductivity than silicon, as discussed above (e.g., diamond, ceramics, etc.), and a lower index of refraction to functionally confine optical mode 430 of the device's optical waveguide, as illustrated.

Device 400 further includes a III-V semiconductor slab including p-type layer 410, active layer 412 and n-type layer

414. In alternative embodiments, layer 410 may be an n-type layer, and layer 414 may be a p-type layer. In other alternative embodiments, layers 410 and 414 may be n-type layers, while active region 412 may include a tunnel junction to convert n-type majority carriers to p-type majority carriers. Overclad regions 416 may be formed on the device to improve mechanical stability.

In this example embodiment, electrodes 420 are thermally in contact with silicon top layer 402.

Electro-optic devices according to prior art solutions would implement cladding layer 404 as a BOX layer (e.g., $SiO_2$). In this embodiment, the heat that is generated in the III-V semiconductor regions travels vertically downwards where it first encounters the silicon portion of the device's waveguide (i.e., layer 402) and subsequently, cladding layer 404. As discussed above, in prior art solutions, although Si has a very high thermal conductivity (130 W/m·K), it is the buried oxide 'cladding' layer that acts as a barrier to heat spreading due to its poor thermal conductivity (1.5 W/m·K).

Overall, this results in poor thermal performance of the device and consequently, a device that cannot operate at high power. Embodiments of the invention, such as electro-optic device 400, address this issue by utilizing cladding layers with improved thermal performance. In one embodiment, said silicon slab comprises a buried Diamond ('BuD') on silicon wafer, wherein cladding layer 404 comprises single crystalline CVD Diamond.

Reference throughout the foregoing specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments. In addition, it is appreciated that the figures provided are for explanation purposes to persons ordinarily skilled in the art and that the drawings are not necessarily drawn to scale. It is to be understood that the various regions, layers and structures of figures may vary in size and dimensions.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

The invention claimed is:

1. A substrate comprising:
   a bulk layer;
   an optical device layer disposed above the bulk layer formed from a first material comprising a low loss material at optical wavelengths and including a waveguiding region; and
   an intermediate layer disposed on and above the bulk layer and below the device layer comprising a second material, different than the first material, having a higher thermal conductivity and a lower index of refraction than the first material and for distributing heat from the optical device layer to the bulk layer and for vertically confining the waveguiding region of the optical device layer, the intermediate layer to at least vertically confine an optical mode of an optical waveguide formed by the optical device layer.

2. The substrate of claim 1, the optical device layer for forming a waveguide of a waveguide photodetector.

3. The substrate of claim 1, wherein the first material comprises one of silicon semiconductor material, or III-V semiconductor material.

4. The substrate of claim 1, wherein the second material comprises chemical vapor deposition (CVD) diamond.

5. The substrate of claim 1, wherein the second material comprises ceramic material.

6. The substrate of claim 1, wherein the intermediate layer is deposited onto the bulk layer.

7. The substrate of claim 1, wherein the intermediate layer is bonded onto the bulk layer.

8. An optical device comprising:
   a bulk layer;
   a waveguide layer disposed above the bulk layer formed from a first material comprising a low loss material at optical wavelengths; and
   an intermediate layer disposed on and above the bulk layer and below the waveguide layer comprising a second material, different than the first material, having a higher thermal conductivity and a lower index of refraction than the first material and for distributing heat from the waveguide layer to the bulk layer and for vertically confining a waveguiding region of the waveguide layer, the intermediate layer to at least vertically confine an optical mode of a waveguide formed from the waveguide layer.

9. The optical device of claim 8, the waveguide layer for forming a waveguide of a waveguide photodetector, the optical device further comprising:
   a photodetection layer disposed above the waveguide layer.

10. The optical device of claim 9, wherein the intermediate layer is bonded onto the bulk layer, the device further comprising:
    a pair of electrical contacts, to collect carriers generated at the photodetection layer.

11. The optical device of claim 10, wherein the pair of electrical contacts are disposed on the intermediate layer.

12. The optical device of claim 11, wherein the pair of electrical contacts comprise N-type and P-type electrodes.

13. The optical device of claim 8, wherein the first material comprises one of silicon semiconductor material, or III-V semiconductor material.

14. The optical device of claim 13, further comprising:
    a III-V semiconductor slab comprising optical device layers and disposed on the waveguide layer;
    wherein the first material comprises silicon semiconductor material, and the intermediate layer to distribute heat from the III-V semiconductor slab and the waveguide layer.

15. The optical device of claim 8, wherein the second material comprises chemical vapor deposition (CVD) diamond.

16. The optical device of claim 8, wherein the second material comprises ceramic material.

17. The optical device of claim 8, wherein the intermediate layer is deposited onto the bulk layer.

* * * * *